(12) United States Patent
Brau et al.

(10) Patent No.: US 8,116,541 B2
(45) Date of Patent: Feb. 14, 2012

(54) METHOD AND APPARATUS FOR MULTI-COIL MAGNETIC RESONANCE IMAGING

(75) Inventors: Anja Christina Sophie Brau, Menlo Park, CA (US); Philip James Beatty, Menlo Park, CA (US)

(73) Assignee: General Electric Company, Schenectady, NY (US)

( * ) Notice: Subject to any disclaimer, the term of this patent is extended or adjusted under 35 U.S.C. 154(b) by 1063 days.

(21) Appl. No.: 11/744,949

(22) Filed: May 7, 2007

(65) Prior Publication Data
US 2008/0279433 A1    Nov. 13, 2008

(51) Int. Cl.
*G06K 9/00* (2006.01)
*A61B 5/00* (2006.01)

(52) U.S. Cl. .................................. 382/128; 600/410

(58) Field of Classification Search .................. None
See application file for complete search history.

(56) References Cited

U.S. PATENT DOCUMENTS

| | | | | |
|---|---|---|---|---|
| 6,275,038 | B1 * | 8/2001 | Harvey | 324/309 |
| 6,841,998 | B1 | 1/2005 | Griswold | |
| 7,282,917 | B1 * | 10/2007 | Brau et al. | 324/318 |
| 7,692,425 | B2 * | 4/2010 | Brau et al. | 324/309 |
| 2005/0100202 | A1 * | 5/2005 | Huang | 382/128 |
| 2006/0050981 | A1 | 3/2006 | Huang | |
| 2006/0064004 | A1 * | 3/2006 | Machida | 600/410 |
| 2008/0012562 | A1 * | 1/2008 | Beatty | 324/307 |
| 2008/0279433 | A1 * | 11/2008 | Brau et al. | 382/131 |

OTHER PUBLICATIONS

Beatty et al., "Anti-aliasing Partially Parallel Encoded Acquisition Reconstruction (APPEAR)", Submitted to MRM in Feb. 2006, 44 pages, Disclosed in IDS submitted on Dec. 28, 2006 for co-pending U.S. Appl. No. 11/456,772.*

Huang et al., k-t GRAPPA: A k-space Implementation for Dynamic MRI with High Reduction Factor, Magnetic Resonance in Medicine 54:1172-1184, Wiley-Liss Inc. (2005).
Felix A. Breuer et al., Dynamic Autocalibrated Parallel Imaging Using Temporal GRAPPA (TGRAPPA), Magnetic Resonance in Medicine 53:981-985, Wiley-Liss Inc. (2005).
C.A. McKenzie et al, Abdominal Three Point Dixon Imaging With Self Calibrating Parallel MRI, . ISMRM 2004, 917.
Jingfei Ma et al, A fast spin echo two-pont Dixon technique and its combination with sensitivity encoding for efficient T2-weighted imaging, Magnetic Resonance Imaging 23:977-982, Elsevier Inc. (2005).
Per Thunberg et al, Accuracy and Reproducibility in Phase Contrast Imaging Using SENSE, Magnetic Resonance in Medicine 50:1061-1068, Wiley-Liss Inc. (2003).
James A. Bankson et al, Partially Parallel Imaging with Phase-Sensitive Data: Increased Temporal Resolution for Magnetic Resonance Temperature Imaging, Magnetic Resonance in Medicine 53:658-665, Wiley-Liss Inc. (2005).

* cited by examiner

*Primary Examiner* — Bhavesh Mehta
*Assistant Examiner* — Tahmina Ansari
(74) *Attorney, Agent, or Firm* — The Small Patent Law Group; Dean D. Small

(57) ABSTRACT

A method for determining weights (or coefficients) for synthesizing k-space data for autocalibrated parallel imaging (API) combines training data sets (including k-space data such as autocalibrating signals (ACS)) acquired at multiple successive time points. Combining training data sets from multiple successive time points together to determine a set of weights increases the accuracy of the calculated weights. The weights may be applied to k-space data from a single or multiple time points. The method retains the phase information of the individual time point images and may thus be applied, for example, to phase-sensitive multi-point imaging such as chemical species separation studies.

20 Claims, 5 Drawing Sheets

METHOD AND APPARATUS FOR MULTI-COIL MAGNETIC RESONANCE IMAGING

TECHNICAL FIELD

The present invention relates generally to magnetic resonance imaging (MRI) systems and in particular, to a method and apparatus for MRI using multiple RF receiver coil elements to accelerate data acquisition.

BACKGROUND

Magnetic resonance imaging (MRI) is a medical imaging modality that can create images of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis", by convention). A MRI system also comprises components called gradient coils that produce smaller amplitude, spatially varying magnetic fields when current is applied to them. Typically, gradient coils are designed to produce a magnetic field component that is aligned along the z axis, and that varies linearly in amplitude with position along one of the x, y or z axes. The effect of a gradient coil is to create a small ramp on the magnetic field strength, and concomitantly on the resonance frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. These coils are used to add energy to the nuclear spin system in a controlled fashion. As the nuclear spins then relax back to their rest energy state, they give up energy in the form of an RF signal. Such signals are detected by the MRI system and are transformed into an image using a computer and known reconstruction algorithms.

MR images may be created by using a two-dimensional (2D) or a three-dimensional (3D) acquisition strategy, the most common of which are rectilinear sampling strategies that fill a 2D or 3D Cartesian grid with Fourier reciprocal space (i.e., "k-space") data. The data may be collected with Nyquist frequency sampling to provide unique location encoding of the MRI signals and thereby prevent aliasing in the reconstructed images. Two-dimensional data is spatially encoded using phase-encoding along the y direction and frequency encoding along the x direction. Three-dimensional data is spatially encoded using phase-encoding along two perpendicular spatial directions (the y and z directions) and frequency-encoding along the third (the x direction). Usually, the secondary phase-encoding is referred to as "slice-encoding," to distinguish it from the primary phase-encoding. The resultant raw data fills a 2D or 3D k-space matrix which is then "reconstructed" into images using Fourier transformation techniques.

To reduce MRI data acquisition time, "parallel imaging" (also known as "partially parallel imaging") techniques may be used in which k-space is under-sampled (i.e., the Nyquist criteria is not met) and the signals from multiple receiver coils are combined to provide aliasing-free images. Parallel imaging techniques use spatial sensitivity profiles of the individual receiver coils in addition to traditional gradient spatial encoding techniques to recover the MRI signals from individual voxels in a source volume of interest. Parallel imaging has been shown to be successful in reducing scan time and has also found application in reducing image blurring and geometric distortions in pulse sequences using long echo trains.

Two families of parallel imaging techniques are known in the art for generating images from incompletely sampled data, based either on the SENSE technique (SENSitivity Encoding) or on the SMASH technique (SiMultaneous Acquisition of Spatial Harmonics). The SENSE-based techniques separately transform the undersampled individual receiver coil k-space data sets into image-space, resulting in spatially aliased images. The aliased images are then combined using weights constructed from measured spatial sensitivity profiles from the individual receiver coils to give a final image with the aliasing artifacts removed. The first SMASH-based techniques developed also used measured spatial sensitivity profiles. These measured spatial sensitivity profiles were used to determine mathematical relationships between neighboring k-space lines in order to synthesize unacquired k-space lines from acquired lines.

More recently, autocalibrated imaging (ACI) techniques based on SMASH, such as AUTO-SMASH, VD-AUTO-SMASH, and GRAPPA, have been developed that do not require a separate acquisition of data to characterize the spatial sensitivity profiles of the individual receiver coils. Instead, a small region in k-space is acquired with full Nyquist sampling as part of an overall undersampled acquisition. The fully sampled region in k-space is used to determine reconstruction weights or coefficients that allow the unacquired data in k-space to be synthesized from the acquired data. The extra data obtained in the fully sampled region in k-space is referred to as autocalibrating signals (ACS).

Many imaging applications require the acquisition of images of the same volume of interest at multiple time points. Such applications may be known as "multi-point studies." For autocalibrating parallel imaging (API) techniques, ACS data from each time point are typically acquired at the same points of k-space, such that consistent SNR and k-space weightings may be achieved for all time points. Increasing the amount of ACS data used in reconstructing an image improves the quality of the reconstruction, however, it also increases the acquisition time. Accordingly, it would be desirable to provide a method for combining k-space data (e.g., data from the fully sampled region of k-space including ACS data) from multiple time points for reconstructing each image in the multi-point study.

BRIEF DESCRIPTION OF THE INVENTION

In accordance with an embodiment, a method for reconstructing magnetic resonance images from data collected at a plurality of time points includes combining at least a first training data set and a second training data set, the first training data set comprising data from a first time point in the plurality of time points and the second training data set comprising data from a second time point in the plurality of time points and calculating a set of weights based on at least the combined first training data set and the second training data set.

In accordance with another embodiment, a method for creating magnetic resonance images includes acquiring a first set of k-spaces at a first time point, the first set of k-spaces comprising a k-space from each radio frequency (RF)

receiver coil element in the plurality of RF receiver coil elements, acquiring a second set of k-spaces at a second time point, the second set of k-spaces comprising a k-space from each RF receiver coil element in the plurality of RF receiver coil elements, defining a first training data set from the first set of k-spaces, defining a second training data set from the second set of k-spaces, defining a combined set of training data sets based on the first training data set and the second training data set and calculating a set of weights based on the combined set of training data sets.

In accordance with another embodiment, a computer-readable medium having computer-executable instructions for performing a method for reconstructing magnetic resonance images from data collected at a plurality of time points includes program code for combining at least a first training data set and a second training data set, the first training data set comprising data from a first time point in the plurality of time points and the second training data set comprising data from a second time point in the plurality of time points and program code for calculating a set of weights based on at least the combined first training data set and the second training data set.

In accordance with another embodiment, an apparatus for generating a magnetic resonance image includes a magnetic resonance imaging assembly including a magnet, a plurality of gradient coils, an array of radio frequency (RF) receiver coil elements, a radio frequency transceiver system, and a pulse generator module, and a computer system coupled to the magnetic resonance imaging assembly and programmed to acquire a first set of k-spaces at a first time point, the first set of k-spaces comprising a k-space from each radio frequency (RF) receiver coil element in the plurality of RF receiver coil elements, acquire a second set of k-spaces at a second time point, the second set of k-spaces comprising a k-space from each RF receiver coil element in the plurality of RF receiver coil elements, define a first training data set from the first set of k-spaces, define a second training data set from the second set of k-spaces, define a combined set of training data sets based on the first training data set and the second training data set and calculate a set of weights based on the combined set of training data sets.

BRIEF DESCRIPTION OF THE DRAWINGS

Embodiments are illustrated by way of example in the figures of the accompanying drawings, in which like reference numerals indicate corresponding, analogous or similar elements, and in which.

DETAILED DESCRIPTION

In the following detailed description, numerous specific details are set forth in order to provide a thorough understanding of embodiments. However it will be understood by those of ordinary skill in the art that the embodiments may be practiced without these specific details. In other instances, well-known methods, procedures, components and circuits have not been described in detail so as not to obscure the embodiments.

Autocalibrated parallel imaging (API) techniques synthesize unacquired k-space data for a single RF receiver coil element using a linear combination of neighboring acquired k-space data from all RF receiver coil elements in an array of RF receiver coil elements. To determine coefficients (i.e., "weights") for the linear combination used to synthesize unacquired k-space data, "target" k-space data points in a fully sampled (i.e., sampled at the Nyquist frequency) region of k-space are fit to a linear combination of neighboring "source" k-space data points from all the RF receiver coil elements. Each combination of a target k-space data point plus associated source k-space data points from all the RF receiver coil elements constitutes a "training data set" forming a single linear equation in a system of such linear equations. Multiple target k-space data points and associated source k-space data points are typically used to increase the determinacy of the system of linear equations and the accuracy of the calculated coefficients or weights. In accordance with an embodiment, for multi-point studies, multiple training data sets from multiple time points may be combined together to determine a single set of coefficients or weights. The coefficients may be applied to k-space data from a single or multiple time points. By combining training data sets from multiple time points, the accuracy of the coefficient (or weight) calculation is improved. Moreover, this method retains the phase information of the individual time point images and may thus be applied, for example, to phase-sensitive multi-point imaging such as chemical species separation studies.

Figure 1:
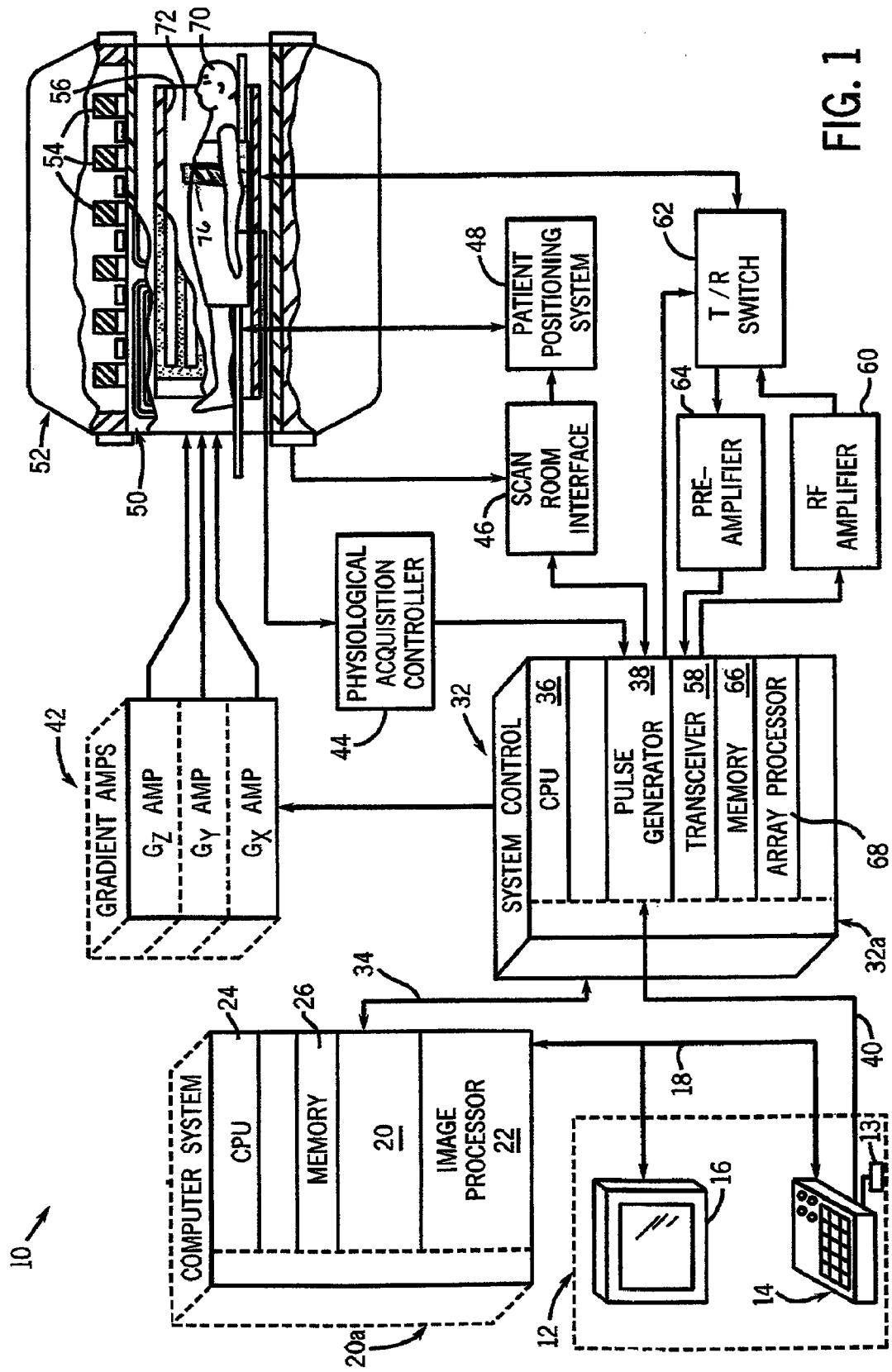
FIG. 1 is a schematic block diagram of an exemplary magnetic resonance imaging system in accordance with an embodiment.

FIG. 1 is a schematic block diagram of an exemplary magnetic resonance imaging system in accordance with an embodiment. The operation of MRI system 10 is controlled from an operator console 12 that includes a keyboard or other input device 13, a control panel 14, and a display 16. The console 12 communicates through a link 18 with a computer system 20 and provides an interface for an operator to prescribe MRI scans, display the resultant images, perform image processing on the images, and archive data and images. The computer system 20 includes a number of modules that communicate with each other through electrical and/or data connections, for example such as are provided by using a backplane 20a. Data connections may be direct wired links, or may be fiber optic connections or wireless communication links or the like. The modules of computer system 20 may include an image processor module 22, a CPU module 24 and a memory module 26 which may include a frame buffer for storing image data arrays. In an alternative embodiment, the image processor module 22 may be replaced by image processing functionality on the CPU module 24. The computer system 20 may also be connected to archival media devices, permanent or back-up memory storage or a network. Computer system 20 may also communicate with a separate control system computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer systems or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., magnet assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests (e.g., radio frequency (RF) waveforms) describing the timing, strength and shape of the RF pulses and pulse sequences to be produced and the timing and length of the data acquisition window. The pulse generator module 38 connects to a gradient amplifier system 42 and produces data called gradient waveforms which control the timing and shape of the gradient pulses that are to be used during the scan. The system control 32 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of Gx, Gy and Gz amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a magnet assembly 52 that includes a polarizing magnet 54 and may include a whole-body RF coil 56, surface or parallel imaging coils 76 or both. The coils 56, 76 of the RF coil assembly may be configured for both transmitting and receiving, or for transmit-only or receive-only. A patient or imaging subject 70 may be positioned within a cylindrical patient imaging volume 72 of the magnet assembly 52. A transceiver module 58 in the system control computer 32 produces pulses that are amplified by an RF amplifier 60 and coupled to the RF coils 56, 76 by a transmit/receive switch 62. RF coil 56 may be replaced or augmented with surface and/or parallel transmit coils such as coils 76. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel coils or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the RF coil 56 during the receive mode. The transmit/receive switch 62 can also enable a separate RF coil (for example, a parallel or surface coil 76) to be used in either the transmit or receive mode.

The MR signals sensed by the RF coil 56 are digitized by the transceiver module 58 and transferred to a memory module 66 in the system control computer 32. MRI data is typically collected in a Fourier space known in imaging as "k-space", a reciprocal space connected to real space via a Fourier transform. Each MR signal is encoded with a particular spatial frequency using "phase-encoding" gradient pulses, and multiple such MR signals are digitized and stored in k-space for later reconstruction as an image. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long term storage or it may be further processed by the image processor 22 and conveyed to the operator console 12 and presented on display 16.

The MRI system described in FIG. 1 may be equipped with an array of RF receiver coil elements, in which each RF receiver coil element separately detects the MRI signals. Such RF receiver coil arrays are well-known in the art and include whole body arrays as well as partial body arrays, such as head coil arrays, cardiac coil arrays, and spine coil arrays. Most arrays of RF receiver coil elements are designed to be compatible with parallel imaging techniques, such that each RF coil element has a different spatial sensitivity profile from other RF coil elements in the array.

Figure 2:
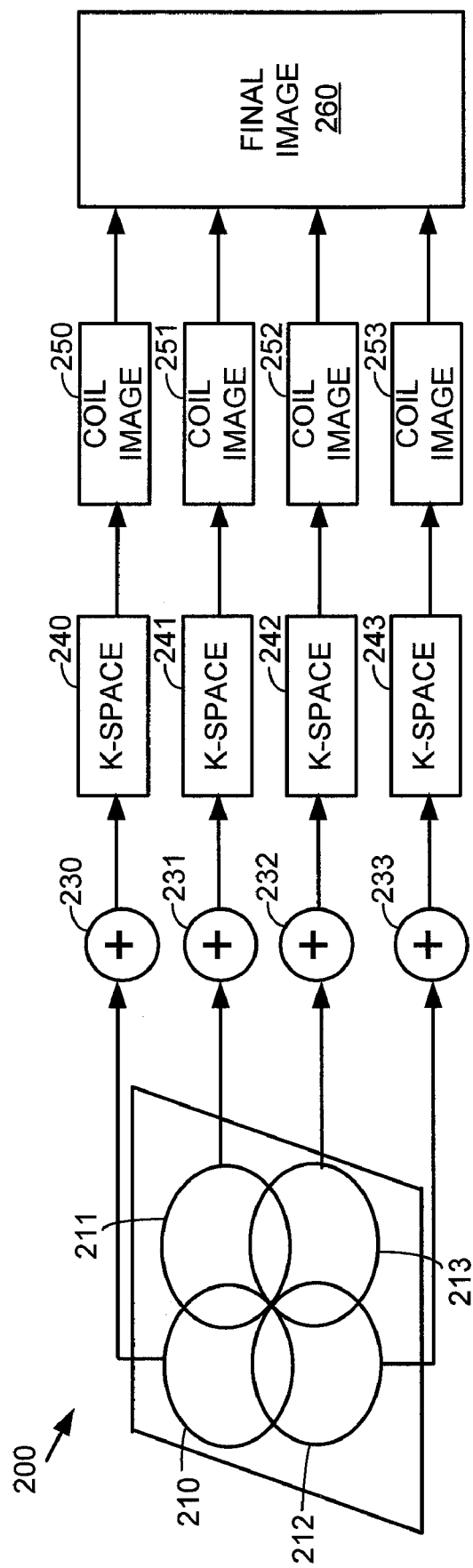
FIG. 2 is a schematic diagram of MRI data reception and processing from an array of RF receiver coil elements in accordance with an embodiment.

FIG. 2 is a schematic diagram of MRI data reception and processing from an array of RF receiver coil elements in accordance with an embodiment. An array of RF receiver coil elements 200 is used to acquire MRI data for a field-of-view (FOV) in a subject and includes four separate RF receiver coil elements 210, 211, 212, 213. Each RF receiver coil element 210, 211, 212, 213 receives sufficient MRI signals to reconstruct an image from the FOV at a particular time point. Although the acquisition of sufficient MRI signals for reconstructing an image requires a finite period of time, the image is typically labeled using a single time point that corresponds to the beginning (or sometimes the middle) of this time period. MRI signals from each RF receiver coil element 210, 211, 212, 213 are transmitted separately to a corresponding data acquisition channel 230, 231, 232, 233, respectively. The MRI signals from each data acquisition channel are used to fill a corresponding (and separate) k-space 240, 241, 242, 243. A separate "coil image" 250, 251, 252, 253 is constructed from each k-space 240, 241, 242, 243. The separate coil images 250, 251, 252, 253 may then be combined using any one of the summation techniques known in the art (e.g., sum of squares) into a final composite image 260. Although FIG. 2 shows the acquisition of MRI data for a single image, multiple images may be acquired at each time point, for example, a stack of images with different locations or a set of images with different orientations may be acquired. In alternative embodiments, three-dimensional k-space data may be obtained and used to reconstruct an image volume.

In a multi-point study, MRI data for multiple sets of k-spaces (such as k-spaces 240, 241, 242, 243) and images (such as images 250, 251, 252, 253) are acquired at successive time points. The successive time points may correspond to sampling time points in, for example, a dynamic MRI study or multi-echo MRI acquisition. For example, in a dynamic contrast-enhanced MRI study, imaging at multiple time points is necessary to characterize the dynamics of contrast enhancement in the tissue. In another example, in a functional MRI study (fMRI), imaging at multiple time points is necessary to characterize the dynamics of neuronal activity. Alternatively, the successive time points may correspond to time points in a phase-sensitive measurement of a quantity such as temperature or velocity (using a phase-contrast technique) or to a multi-point chemical species separation study. Examples of multi-point chemical species separation studies include Dixon and IDEAL imaging, in which imaging is performed at multiple time points (i.e., relative phases of multiple chemical species) to resolve MRI signals corresponding to each chemical species.

One skilled in the art will appreciate that the array of receiver RF coils illustrated in FIG. 2 is exemplary and many other receiver coil array geometries may be used in accordance with embodiments.

For autocalibrated parallel imaging (ACI) techniques, a relationship between neighboring k-space data points (that arises from spatial sensitivity profiles of the coil elements) is determined in a fully sampled region of k-space and the relationship may be used to synthesize unacquired k-space data for undersampled regions of k-space from acquired k-space data. Each k-space data point for a single coil can be represented as a linear combination of its neighboring k-space data points from all coil elements and the same set of coefficients (or weights) for the linear combination can be applied to all k-space locations to synthesize unacquired k-space data.

Figure 3:
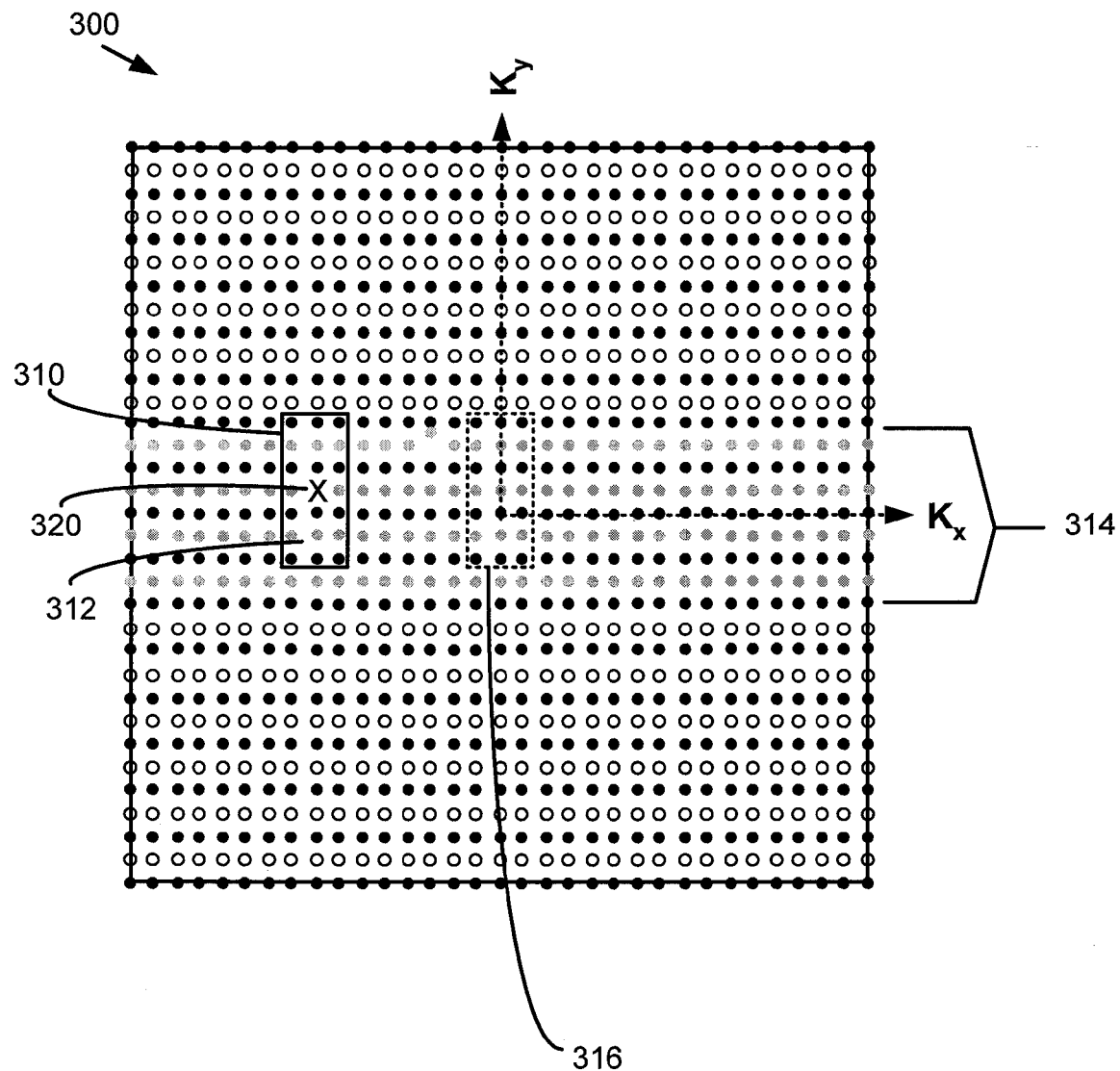
FIG. 3 is a schematic diagram showing an exemplary ACI sampling pattern in accordance with an embodiment.

FIG. 3 is a schematic diagram showing an exemplary ACI sampling pattern in accordance with an embodiment. A single k-space 300, such as is shown in FIG. 3, may be generated for each RF receiver coil element (e.g., coils elements 210, 211, 212, 213, shown in FIG. 2) for each time point in a multi-point study. FIG. 3 shows a 2D k-space 300 composed of a 32×32 matrix of k-space elements in which outer regions are under-sampled by a "reduction factor", R=2, and a central region 314 is fully sampled. Acquired k-space data are shown as black circles at every second phase-encoding ($k_y$) line. Unacquired (i.e., "skipped") k-space data points are shown as open circles. An additional number of acquired k-space data points, shown in light gray, are called Auto-Calibration Signals (ACS). ACS points are typically acquired near the center of k-space, but could also be acquired in other parts of k-space. In addition, the calibration data can be acquired during, before, or after the accelerated scan. For the example shown in FIG. 3, the acquisition of ACS points results in full Nyquist frequency sampling for the inner quarter of k-space. The fully sampled regions of k-space from multiple time points in a multi-point study may be used to determine the relationship between k-space lines that results from the spatial sensitivity profiles of the RF coil elements. The relationship between the k-space lines may then be exploited to synthesize the unacquired k-space data in the outer, undersampled regions of k-space.

K-space data points in the fully sampled region 314 of k-space may be used as a "target" k-space data point. Each "target" k-space data point from a single coil element may be expressed as a linear combination of the complex data from multiple acquired neighboring "source" k-space data points from all of the receiver coil elements. In a "training phase," coefficients (i.e., weights) for the linear combination are determined. In a "synthesis phase," the weights are used to synthesize the unacquired k-space data in the outer, undersampled regions of k-space. In the training phase, multiple target k-space data points are defined where each target k-space data point is acquired by a single coil of the receiver coil array. For each target k-space data point, multiple associated neighboring source k-space data points are defined from all coil elements in k-space. The neighboring source k-space data points have a pre-determined geometric relationship in k-space to the target k-space data point. Each target k-space data point, together with its multiple associated source k-space data points constitutes a "training data set". For each target k-space data point, the associated source k-space data points have the same geometric relationship to the target k-space data point. In FIG. 3, a window 310 defines a region 312 containing an exemplary target k-space data point 320, marked with "X", and multiple source k-space data points, designated using black circles. The target k-space data point 320 together with its associated group of source k-space data points constitutes a single training data set. The training data set defined by window 310 uses a 2D kernel, in which the group of source k-space data points includes source k-space data points with non-zero displacements from target k-space data point 320 in both the $k_x$ and $k_y$ directions. It is also possible to use a 1D kernel, in which the group of source k-space data points includes only source k-space data points that have the same $k_x$ value as the target k-space data point, or a 3D kernel in the case of a 3D acquisition, in which the group of k-space data points includes k-space data points along the $k_x$, $k_y$, and $k_z$ directions. Multiple training data sets may be derived by translating the window 310 to other target k-space data points in the fully sampled central region 314 of k-space for the time point represented by k-space 300 (as shown, for example, by a dashed window 316 equal in size to window 310) and other time points in the multi-point study. As discussed further below, the training data sets from multiple time points may be combined to determine a single set of coefficients (or weights) for a particular time point that may be used to synthesize unacquired k-space data.

Figure 4:
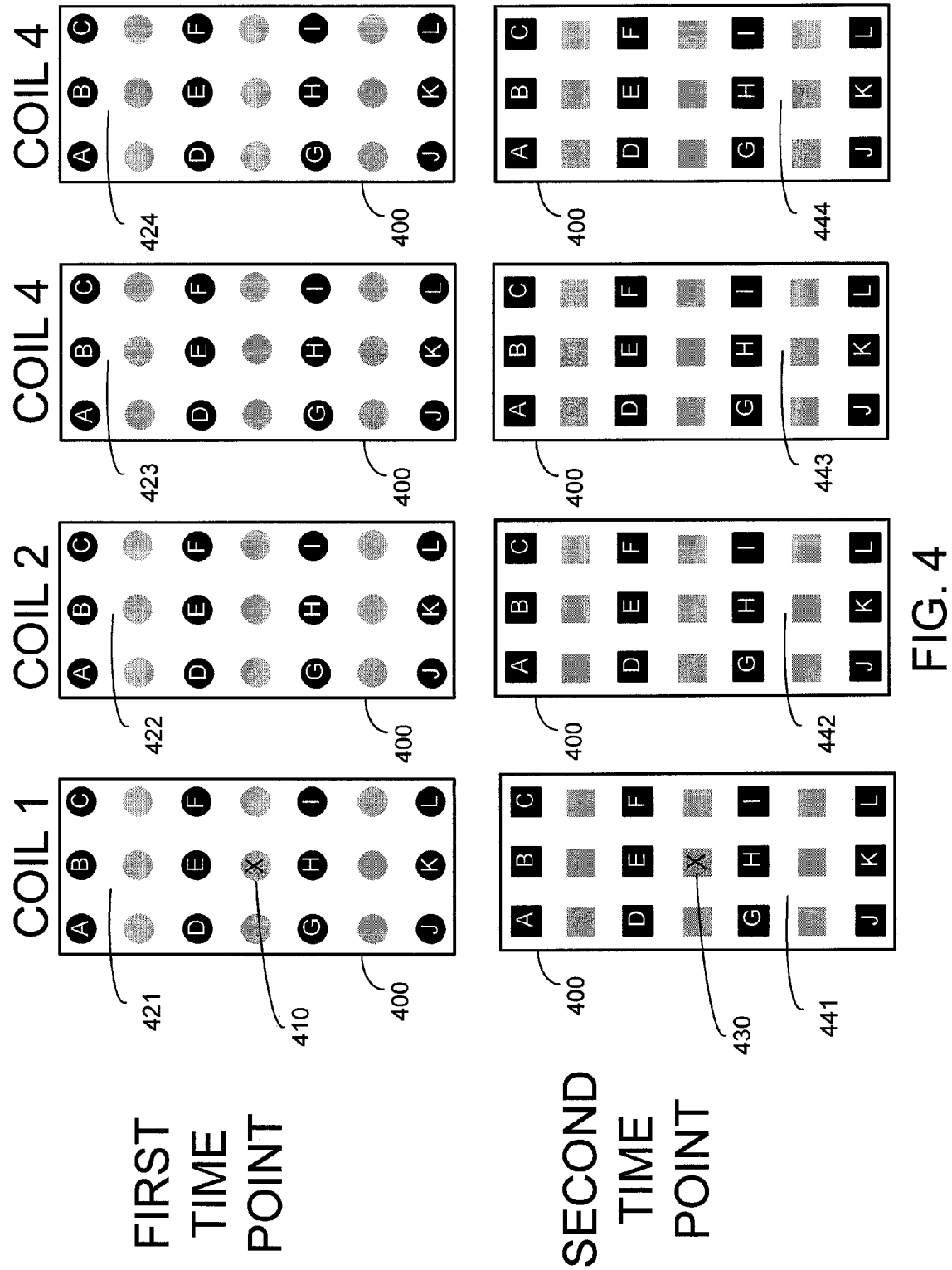
FIG. 4 is a schematic diagram showing exemplary training data sets for a four-element RF coil array from two successive time points.

FIG. 4 is a schematic diagram showing exemplary training data sets for a four-element RF coil array from two successive time points. A window 400 defines k-space regions 421, 422, 423, 424 corresponding to four coil elements respectively (e.g., coil elements 210, 211, 212, 213 shown in FIG. 2) for a first time point. Window 400 defines a 3×7 array of acquired k-space data points (black circles) and ACS data points (gray circles) for each of the four coil elements for the first time point. A complex signal at a target k-space data point 410 marked with an "X" in region 421 may be expressed as a linear combination of acquired complex signals from source k-space data points labeled A-L from all the RF coil elements (i.e., from k-space regions 421, 422, 423, 424). A linear equation may be formed expressing a relationship between the target k-space data point 410 and source k-space data points A-L from all the coil elements. Additional target k-space data points (not shown) from the fully sampled region of k-space (e.g., region 314 shown in FIG. 3) may also be expressed as a linear combination of their associated source k-space data points using the same coefficients, as long as the geometric relationship between the target k-space data point and source k-space data points is held constant for each target k-space data point. By sliding (or translating) the window 400 to select a new target k-space data point and associated source k-space data points, the geometric relationship between the target and source k-space data points may be held constant for each target k-space data point. Each new location for window 400 defines an additional training data set for the derivation of coefficients (or weights) for the system of linear equations, thereby increasing the determinacy of the derivation. In accordance with an embodiment, additional training data sets are derived using target k-space data points and source k-space data points from other time points in a multi-point study. For example, window 400 may also define a second training data set for a second time point, consisting of k-space regions 441, 442, 443 and 444. A second target k-space data point 430 is shown in the k-space region 441. For the second time point, window 400 includes acquired k-space data points (black squares) and ACS data points (grey squares) for the four coil elements. Target k-space data point 430 may be expressed as a linear combination of source k-space data points labeled A-L from all RF coil elements (i.e., from k-space regions 441, 442, 443, 444). A plurality of training data sets may also be derived for other target k-space data points from the second time point. Although this exemplary embodiment uses the window 400 to define training data sets, the use of such a window is not necessary. Training data sets may be defined using any method, as long as the geometric relationship of each of the source k-space data points relative to the target k-space data point is held constant.

The training data sets derived from k-space data from multiple time points (e.g., training data sets from the first time point and the second time point shown in FIG. 4) may be combined to determine the coefficients (or weights) used to synthesize k-space data for a particular time point. Various methods may be used to determine the weights based on the training data sets. For example, a series of training data sets may be combined to form a matrix equation $D_s w = D_t$, where w contains the weights (or coefficients) that fit source k-space data $D_s$ from all coil elements to target k-space data $D_t$ on a single coil. The weights (or coefficients) may be estimated using $\hat{w} = D_s^+ D_t$, where "+" denotes the pseudo-inverse, and $D_s$ and $D_t$ are comprised of known source and target k-space data, respectively, taken from the fully sampled region of k-space. The number of rows in $D_s$ and $D_t$ corresponds to the number of training data sets. Alternatively, other matrix approaches or any other approach for solving a system of linear equations may be used to determine the weights.

Figure 5:
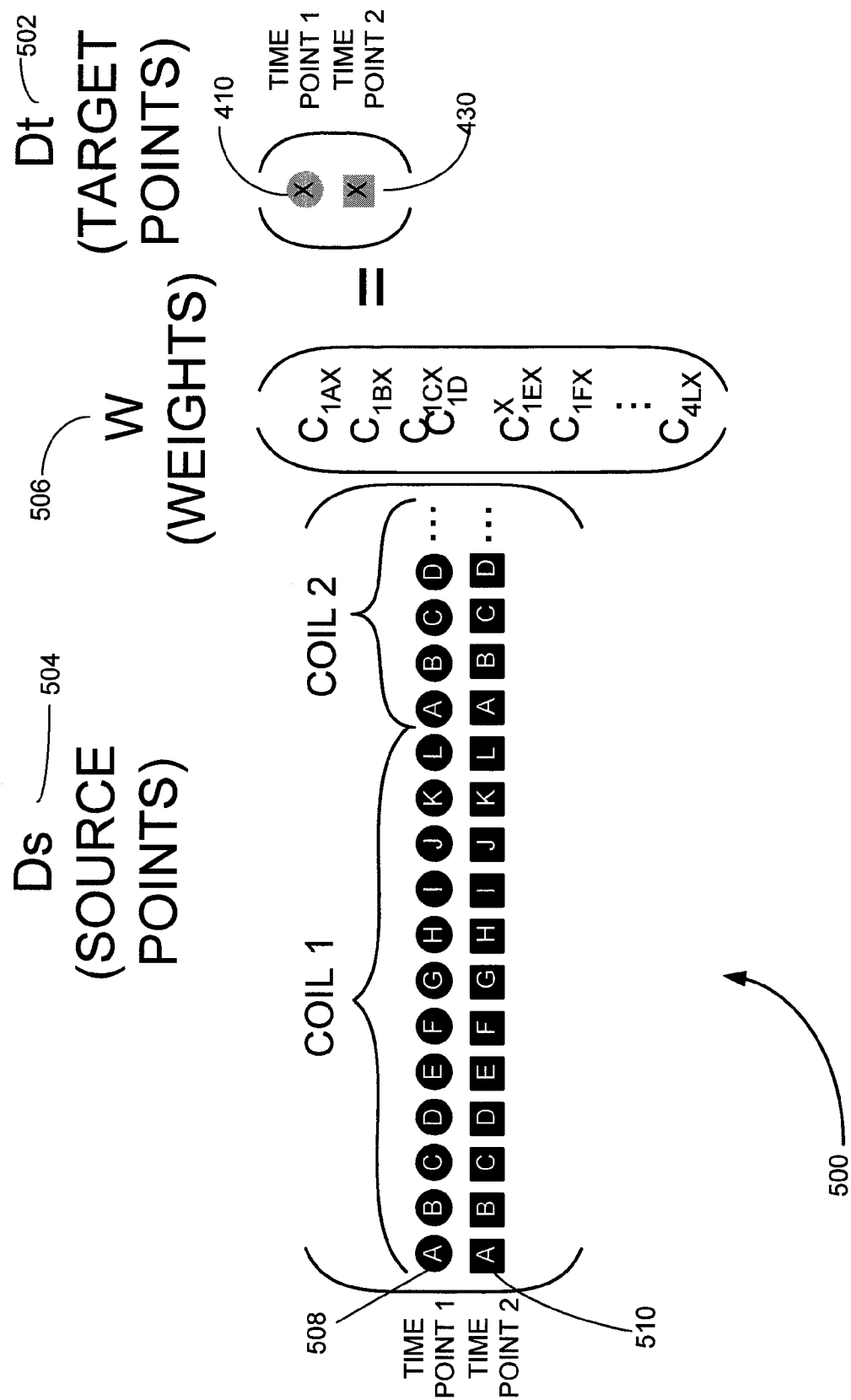
FIG. 5 is a schematic diagram showing the composition of an exemplary matrix equation from the exemplary training data sets shown in FIG. 4.

FIG. 5 is a schematic diagram showing the composition of an exemplary matrix 500 from the exemplary training data sets shown in FIG. 4. As mentioned, the training data sets from multiple time points may be used to determine the weights (or coefficients). The target k-space data point 410 (also shown in FIG. 4) from the first time point forms a first element of a column vector $D_t$ 502 and the target k-space data point 430 (also shown in FIG. 4) from the second time point forms the second element of the column vector $D_t$ 502. The source k-space data points A-L for the first time point from all four coil elements (also shown in FIG. 4) form a first row 508 of elements of a matrix $D_s$ 504 and the source k-space data points A-L for the second time point from all four coil elements (also shown in FIG. 4) form a second row 510 of elements of a matrix $D_s$ 504. The unknown weights (or coefficients) form a column vector 506, w, with a number of elements equal to the number of source k-space data points. Additional training data sets derived from other target k-space data points from either the first or second data point may be added to matrix 500 by creating additional rows in the matrix $D_s$ 504 and adding additional elements to the vector $D_t$ 502. Increasing the number of training data sets in matrix 500 can increase the determinacy and the accuracy of the calculated weights.

After the weights (or coefficients) are determined in the training phase, the undersampled outer portions of k-space for a particular time point are filled by synthesizing k-space data using the weights in the synthesis phase. When the individual k-spaces from each coil element for a particular time point are filled with acquired and synthesized k-space data, individual coil images may be reconstructed using known reconstruction techniques such as Fourier transform techniques. To combine the individual coil images into a single resultant image, known summation techniques may be used. An exemplary summation technique that maximizes signal-to-noise ratio in the resultant image is a sum-of-squares technique. For phase-sensitive studies such as multi-point chemical species separation studies, phase-sensitive summation techniques may be used.

For a multi-point study with many time points, a "sliding window" approach may be used, in which training data sets from a limited number of neighboring time points are used to calculate the weights for each particular time point. For each time point in the study, a sliding window defines which of the neighboring time points are used for the weight (or coefficient) determination for that time point. It is not necessary that all imaging parameters related to the acquisition of MRI data remain constant for all time points in the multi-point study. It is only necessary that the imaged object is approximately the same and that the geometric relationship of the coil elements to the imaged object stays approximately constant throughout. Some dynamic change in the imaged object (for example, contrast enhancement or motion due to the cardiac cycle) or small displacements of the coil elements during the study may be tolerated.

Combining training data sets from multiple neighboring time points is not limited to parallel imaging methods in which both the training and synthesis phases are performed in the k-space domain, but rather has the flexibility to be performed in k-space, hybrid space (in which a transform into image space has been applied along one or more dimensions but other dimensions have not been transformed), image space, or combinations thereof. Moreover, training data sets from multiple neighboring time points may be combined for any pulse sequence that is compatible with an auto-calibrated parallel imaging technique. While exemplary embodiments have been presented using 2D MRI techniques, the method may easily be extended by one skilled in the art to 3D MRI techniques.

Computer-executable instructions for reconstructing auto-calibrated MRI data according to the above-described method may be stored on a form of computer readable media. Computer readable media includes volatile and nonvolatile, removable and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital versatile disks (DVD) or other optical storage, magnetic cassettes, magnetic tape, magnetic disk storage or other magnetic storage devices, or any other medium which can be used to store the desired instructions and which may be accessed by MRI system 10 (shown in FIG. 1), including by internet or other computer network forms of access.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

We claim:

1. A method for reconstructing magnetic resonance images from data collected at a plurality of time points using a plurality of radio frequency (RF) coils, the method comprising:
   combining at least a first training data set, including a first target k-space data point, acquired from a single RF coil of the plurality of RF coils, and a first set of source k-space data points acquired from the plurality of RF coils, and a second training data set, including a second target k-space data point and a second set of source k-space data points, the first training data set comprising data from a first time point in the plurality of time points and the second training data set comprising data from a different second time point in the plurality of time points;
   calculating a set of weights based on at least the combined first training data set and the second training data set.

2. A method according to claim 1, further comprising reconstructing at least one coil image using the set of weights to synthesize unacquired data.

3. A method according to claim 1, wherein the first training data set and the second training data set are defined in k-space.

4. A method according to claim 1, wherein the first training data set and the second training data set are defined in a hybrid space.

5. A method according to claim 1, wherein combining at least a first training data set and a second training data set comprises defining a subset of the plurality of time points from which to select the at least first training data set and second training data set.

6. A method according to claim 1, wherein the data collected at the plurality of time points are collected in accordance with a contrast-enhanced MRI study.

7. A method according to claim 1, wherein the data collected at the plurality of time points are collected in accordance with a functional MRI study.

8. A method according to claim 1, wherein the data collected at the plurality time points are collected in accordance with a multi-point chemical species separation MRI study.

9. A method according to claim 1, wherein the data collected at the plurality of time points are collected in accordance with a phase-contrast MRI study.

10. A method according to claim 1, wherein the data collected at the plurality of time points are collected in accordance with a temperature measurement MRI study.

11. A method according to claim 1, wherein the data collected at the plurality of time points are collected in accordance with a multi-echo MRI acquisition.

12. A method according to claim 1, wherein the data collected at the plurality of time points are collected in accordance with a multi-point dynamic MRI study.

13. A method for creating magnetic resonance images using a magnetic resonance imaging (MRI) system having a plurality of RF receiver coil elements, the method comprising:
   acquiring a first set of k-spaces at a first time point, the first set of k-spaces comprising an k-space from each radio frequency (RF) receiver coil element in the plurality of RF receiver coil elements;
   acquiring a second set of k-spaces at a second time point, the second set of k-spaces comprising an k-space from each RF receiver coil element in the plurality of RF receiver coil elements;
   defining a first training data set from the first set of k-spaces, the first training data set including a first target k-space data point and a first set of source k-space data points;
   defining a second training data set from the second set of k-spaces, the second training data set including a different second target k-space data point and a different second set of source k-space data points, the second target k-space data point being acquired at a different time than the first target k-space data point;
   defining a combined set of training data sets based on the first training data set and the second training data set; and
   calculating a set of weights based on the combined set of training data sets.

14. A method according to claim 13, further comprising reconstructing a coil image for each RF receiver coil element in the plurality of RF receiver coil elements using the set of weights to synthesize unacquired data.

15. A method according to claim 14, further comprising combining each coil image for the plurality of RF receiver coil elements to reconstruct a final resultant image.

16. A non-transitory computer-readable medium having computer-executable instructions for performing a method for reconstructing magnetic resonance images from data collected at a plurality of time points using a plurality of radio frequency (RF) coils, the computer-readable medium comprising:
   program code for combining at least a first training data set including a first target k-space data point acquired from a single RF coil of the plurality of coils and a first set of source k-space data points acquired from the plurality of RF coils, and a second training data set including a second target k-space data point and a second set of source k-space data points, the first training data set comprising data from a first time point in the plurality of time points and the second training data set comprising data from a different second time point in the plurality of time points; and
   program code for calculating a set of weights based on at least the combined first training data set and the second training data set.

17. An apparatus for generating a magnetic resonance image, the apparatus comprising:
   a magnetic resonance imaging assembly comprising a magnet, a plurality of gradient coils, a plurality of radio frequency (RF) receiver coil elements, a radio frequency transceiver system, and a pulse generator module; and
   a computer system coupled to the magnetic resonance imaging assembly and programmed to:
   acquire a first set of k-spaces at a first time point, the first set of k-spaces comprising an k-space from each radio frequency (RF) receiver coil element in the plurality of (RF) receiver coil elements;
   acquire a second set of k-spaces at a second time point, the second set of k-spaces comprising an k-space from each RF receiver coil element in the plurality of RF receiver coil elements;
   define a first training data set from the first set of k-spaces, the first training data set including a first target k-space data point and a first set of source k-space data points;
   define a second training data set from the second set of k-spaces, the second training data set including a different second target k-space data point and a different second set of source k-space data points, the second target k-space data point being acquired at a different time than the first target k-space data point;
   define a combined set of training data sets based on the first training data set and the second training data set; and
   calculate a set of weights based on the combined set of training data sets.

18. An apparatus according to claim 17, wherein the computer system is further programmed to reconstruct a coil image for each RF receiver coil element in the plurality of RF receiver coil elements using the set of weights to synthesize unacquired data.

19. An apparatus according to claim 18, wherein the computer system is further programmed to combine each coil image for the plurality of RF receiver coil elements to reconstruct a final resultant image.

20. A method according to claim 1, further comprising acquiring source k-space data points that have a pre-determined geometric relationship, in k-space, to the target k-space data point.

* * * * *